(12) United States Patent
Tran et al.

(10) Patent No.: US 9,379,700 B2
(45) Date of Patent: Jun. 28, 2016

(54) DUAL-VOLTAGE DETECTOR HAVING DISABLE OUTPUTS WITHIN SEPARATE VOLTAGE DOMAIN AND RELATED METHODS

(71) Applicants: Dzung T. Tran, Austin, TX (US); Trong D. Nguyen, Austin, TX (US)

(72) Inventors: Dzung T. Tran, Austin, TX (US); Trong D. Nguyen, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 193 days.

(21) Appl. No.: 14/187,450

(22) Filed: Feb. 24, 2014

(65) Prior Publication Data

US 2015/0244359 A1    Aug. 27, 2015

(51) Int. Cl.
  *H03L 7/00*  (2006.01)
  *H03K 17/22*  (2006.01)
(52) U.S. Cl.
  CPC .................................. *H03K 17/223* (2013.01)
(58) Field of Classification Search
  USPC ........................................................ 327/143
  See application file for complete search history.

(56) References Cited

U.S. PATENT DOCUMENTS

| 4,013,902 | A | 3/1977 | Payne |
| 6,084,446 | A | 7/2000 | Chen et al. |
| 7,161,396 | B1 | 1/2007 | Zhou et al. |
| 7,619,444 | B1 * | 11/2009 | Shaikh ........... H03K 19/017545 326/68 |
| 2003/0202379 | A1 * | 10/2003 | Yoshimura ............. G11C 16/30 365/185.18 |

* cited by examiner

*Primary Examiner* — Lincoln Donovan
*Assistant Examiner* — Patrick Chen

(57) ABSTRACT

Dual-voltage detectors and related methods are disclosed that receive control signals from a first supply voltage domain and provide multiple disable outputs within a separate supply voltage domain. The disclosed embodiments detect a power supply status in one supply voltage domain (e.g., 1.2 volts, ground) and then assert low voltage disable or reset signals to downstream circuitry within a different supply voltage domain that is powered with different supply voltages (e.g., 1.8 volts, 0.9 volts, ground). In certain embodiments, the dual-voltage detectors provide two disable signals to stacked output drivers that are used to tri-state the stacked output drivers to place them in a high-impedance (HIGH-Z) state, for example, during power-up or power-down operations.

21 Claims, 5 Drawing Sheets

DUAL-VOLTAGE DETECTOR HAVING DISABLE OUTPUTS WITHIN SEPARATE VOLTAGE DOMAIN AND RELATED METHODS

TECHNICAL FIELD

This technical field relates to voltage detectors and input/output cells for integrated circuits.

BACKGROUND

Some integrated circuits include input/output (I/O) cells located in I/O rings close to the outer edge of the integrated circuit. The I/O cells are used to receive input signals from external devices and to output signals to external devices. In such an integrated circuit with an I/O ring, voltage detector circuits can be used to tri-state the I/O cells to place them in a high impedance state during power-up and/or power-down of the integrated circuit to prevent potential crowbar current in the I/O output driver. These voltage detectors, for example, can be used within microcontroller integrated circuits to allow the microcontroller to be powered-up or powered-down in any sequence. For example, where a core power supply voltage and a different I/O power supply voltage are used, the core supply voltage can be powered-up before or after the I/O power supply is powered-up. In prior solutions, however, these voltage detector circuits have had large space and high power requirements. Further, prior detector solutions have single power supply voltages that are used for core circuitry, the voltage detector, and I/O ring.

DESCRIPTION OF THE DRAWINGS

It is noted that the appended figures illustrate only example embodiments and are, therefore, not to be considered as limiting the scope of the present invention. Elements in the figures are illustrated for simplicity and clarity and have not necessarily been drawn to scale.

DETAILED DESCRIPTION

Dual-voltage detectors and related methods are disclosed that receive control signals from a first supply voltage domain and provide multiple disable outputs within separate supply voltage domain. The disclosed embodiments provide low power and relatively simple voltage detector circuitry that can provide output voltage levels to control both the pull-up and pull-down driver paths of a stacked output driver design. The disclosed embodiments detect a power supply status in one supply voltage domain (e.g., 1.2 volts, ground) and then assert low voltage disable or reset signals to downstream circuitry within a different supply voltage domain that is powered with different supply voltages (e.g., 1.8 volts, 0.9 volts, ground). In certain embodiments, the dual-voltage detectors provide two disable signals to stacked output drivers that are used to tri-state the stacked output drivers to place them in a high-impedance (HIGH-Z) state, for example, during power-up or power-down operations. The disclosed embodiments can be utilized with any desired stacked circuit design and can be adjusted between active high and active low operation by adding or removing inverters in the drive outputs. In one implementation, the disclosed embodiments can be used to provide disable signals to input/output (I/O) cells for a microcontroller configured to drive DDR-DRAMs (dual data rate dynamic random access memories) in a stacked I/O design powered by a 1.8 volt supply voltage while still using lower voltage (e.g., 1.2 volt) thin oxide CMOS (complimentary metal-oxide-semiconductor) transistors. Different features and variations can be implemented, as desired, and related or modified systems and methods can be utilized, as well.

Figure 1:
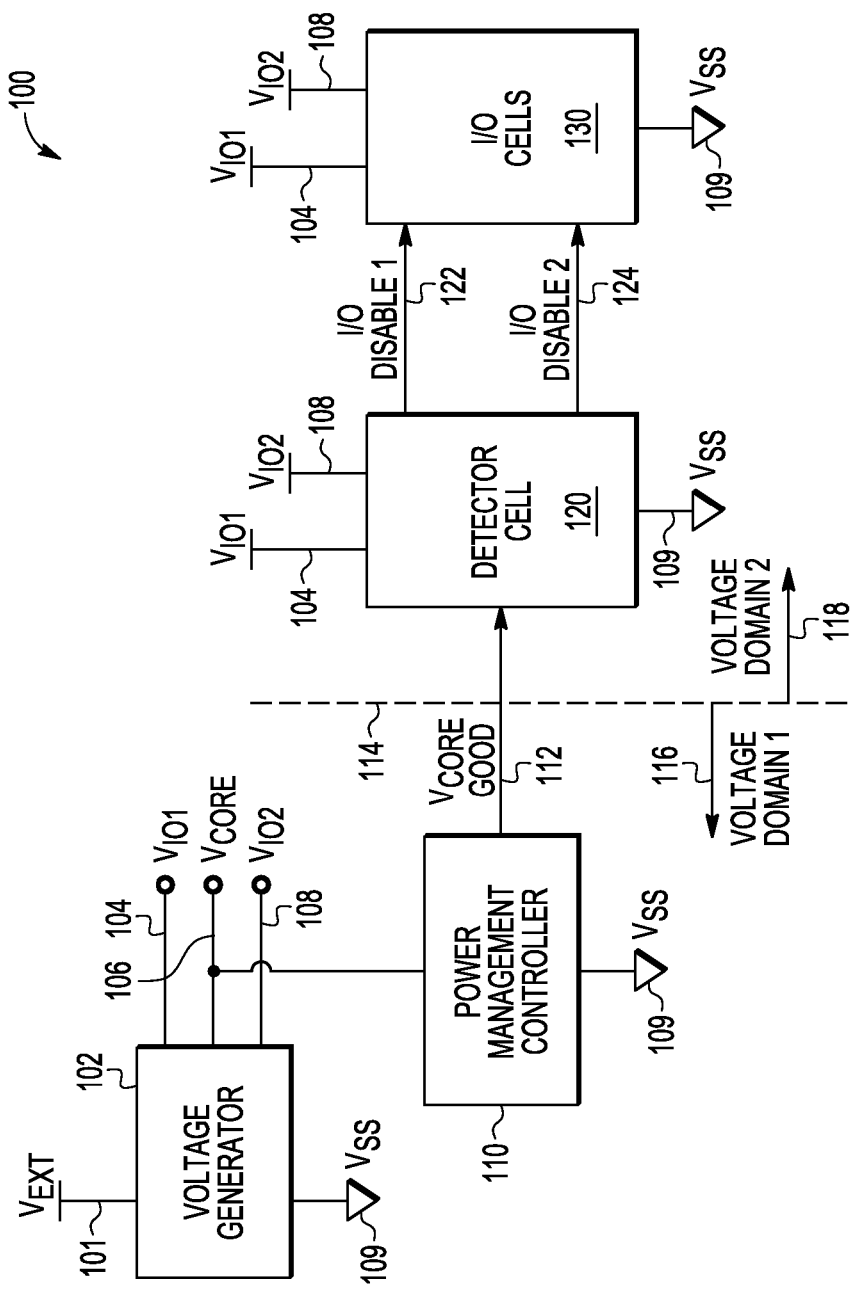
FIG. 1 is a block diagram of an example embodiment for a system including a dual-voltage detector that receives a control signal from a first supply voltage domain and provides multiple input/output disable signals within a second supply voltage domain.

FIG. 1 is a block diagram of an example embodiment 100 for a system including a dual-voltage detector 120 that receives signals based upon a first supply voltage domain and provides multiple I/O disable signals based upon a second supply voltage domain. For the embodiment 100 depicted, a first voltage domain 116 is located to the left of dashed line 114, and a second voltage domain 118 is located right of the dashed line 114. As described herein, the detector 120 operates in the second voltage domain 118 while detecting the condition of a supply voltage from the first voltage domain 116. It is further noted that a particular voltage domain will provide power to circuitry using a set of two or more power supply voltages, and a different voltage domain will then provide power to circuitry using a different set of two or more power supply voltages. As one example for the embodiments described herein, the first supply voltage domain can use 1.2 volts and ground ($V_{SS}$) as its power supply voltages, and the second voltage domain can use 1.8 volts, 0.9 volts, and ground ($V_{SS}$) as its power supply voltages. Different voltage levels and numbers of supply voltages could also be used, as well as additional voltage domains.

Looking back to FIG. 1 and the blocks within the first voltage domain 116, a voltage generator 102 within an integrated circuit is connected to an external supply voltage ($V_{EXT}$) 101 and ground ($V_{SS}$) 109. The voltage generator 102 generates a core supply voltage ($V_{CORE}$) 106 that is used as a supply voltage for core circuitry within the integrated circuit, such as for example microcontroller circuitry within a system-on-a-chip (SOC) integrated circuit. The voltage generator 102 also generates a first I/O supply voltage ($V_{IO1}$) 104 and a second I/O supply voltage ($V_{IO2}$) 108 that are used as supply voltages for I/O cells 130. The power management controller 110 receives the core supply voltage ($V_{CORE}$) 106 and ground ($V_{SS}$) 109 and asserts a control signal ($V_{CORE}$ GOOD) 112 when the core supply voltage ($V_{CORE}$) 106 has reached a stable operational level, such as for example after power-up or reset.

Looking now to blocks within the second voltage domain 118, the dual-voltage detector 120 receives the control signal ($V_{CORE}$ GOOD) 112 from the power management controller 110. The dual-voltage detector 120 also receives the first I/O supply voltage ($V_{IO1}$) 104, the second I/O supply voltage ($V_{IO2}$) 108, and ground ($V_{SS}$) 109. As described in more detail below, the detector 120 generates two disable signals that are applied to the I/O cells 130 such that the first I/O disable signal (I/O DISABLE1) 122 operates between a first set of voltage levels, and the second I/O disable signal (I/O DISABLE2) 124 operates between a second set of voltage levels. These disable signals 122/124 are applied to the I/O cells 130 to tri-state them to be in a high impedance state when the control signal ($V_{CORE}$ GOOD) 112 is de-asserted indicating that the core supply voltage is not stable. The I/O cells 130 also receive the first I/O supply voltage ($V_{IO1}$) 104, the second I/O supply voltage ($V_{IO2}$) 108, and ground ($V_{SS}$) 109.

Figure 2:
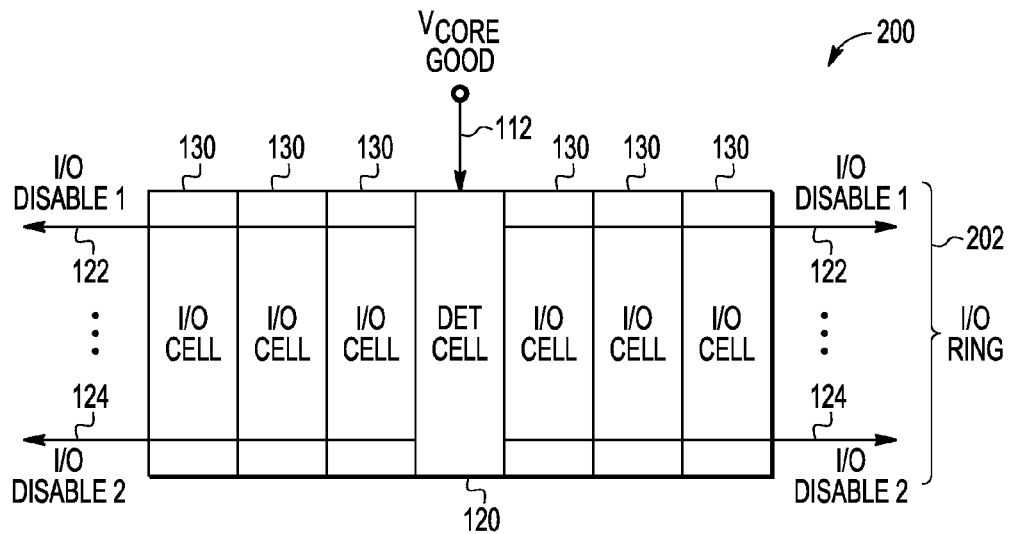
FIG. 2 is a block diagram of an example embodiment for an input/output ring that includes input/output cells and a dual-voltage detector.

FIG. 2 is a block diagram 200 of an example embodiment for an I/O ring 202 that includes I/O cells 130 and a dual-voltage detector 120. As described above, the detector 120 receives the control signal ($V_{CORE}$ GOOD) 112 that is asserted when the core supply voltage is stable. The detector 120 then provides the two disable signals 122/124 to tri-state the I/O cells 130 when the control signal ($V_{CORE}$ GOOD) 112 is de-asserted indicating that the core supply voltage is not stable. Advantageously, the detector 120 can be positioned within the I/O ring 202.

Figure 3:
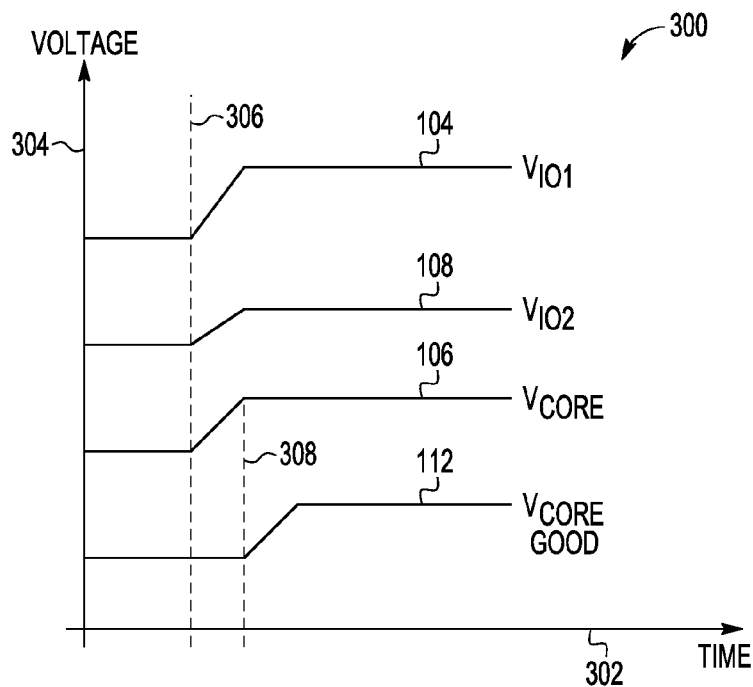
FIG. 3 is a timing diagram of an example embodiment for supply voltage levels and a supply voltage control signal at power-up.

FIG. 3 is a timing diagram 300 of an example embodiment for supply voltage levels and the control signal ($V_{CORE}$ GOOD) 112 at power-up. Dashed line 306 represents the time at which the voltage levels rise after power-up. As depicted, the first I/O supply voltage ($V_{IO1}$) 104, the second I/O supply voltage ($V_{IO2}$) 108, and the core supply voltage ($V_{CORE}$) 106 rise from ground to their stable, steady state values after power-up. These voltages levels can be, for example, 1.8 volts for the first I/O supply voltage ($V_{IO1}$) 104; 0.9 volts for the second I/O supply voltage ($V_{IO2}$) 108; and 1.2 volts for the core supply voltage ($V_{CORE}$) 106. Other voltage levels could also be used. Once the core supply voltage ($V_{CORE}$) 106 becomes stable, the control signal ($V_{CORE}$ GOOD) 112 is asserted and will rise to the core supply voltage ($V_{CORE}$) 106, as shown with respect to the time represented by dashed line 308. As described above, the core supply voltage ($V_{CORE}$) 106 is from the first supply voltage domain and will, therefore, rise to the level of the core supply voltage ($V_{CORE}$) 106 (e.g., 1.2 volts). For embodiment 300, the asserted state of the control signal ($V_{CORE}$ GOOD) 112 is a high logic level, and the de-asserted state is a low logic level, although it would be understood that these voltage levels as well as other logic levels described herein could be swapped in other implementations, if desired.

Figure 4:
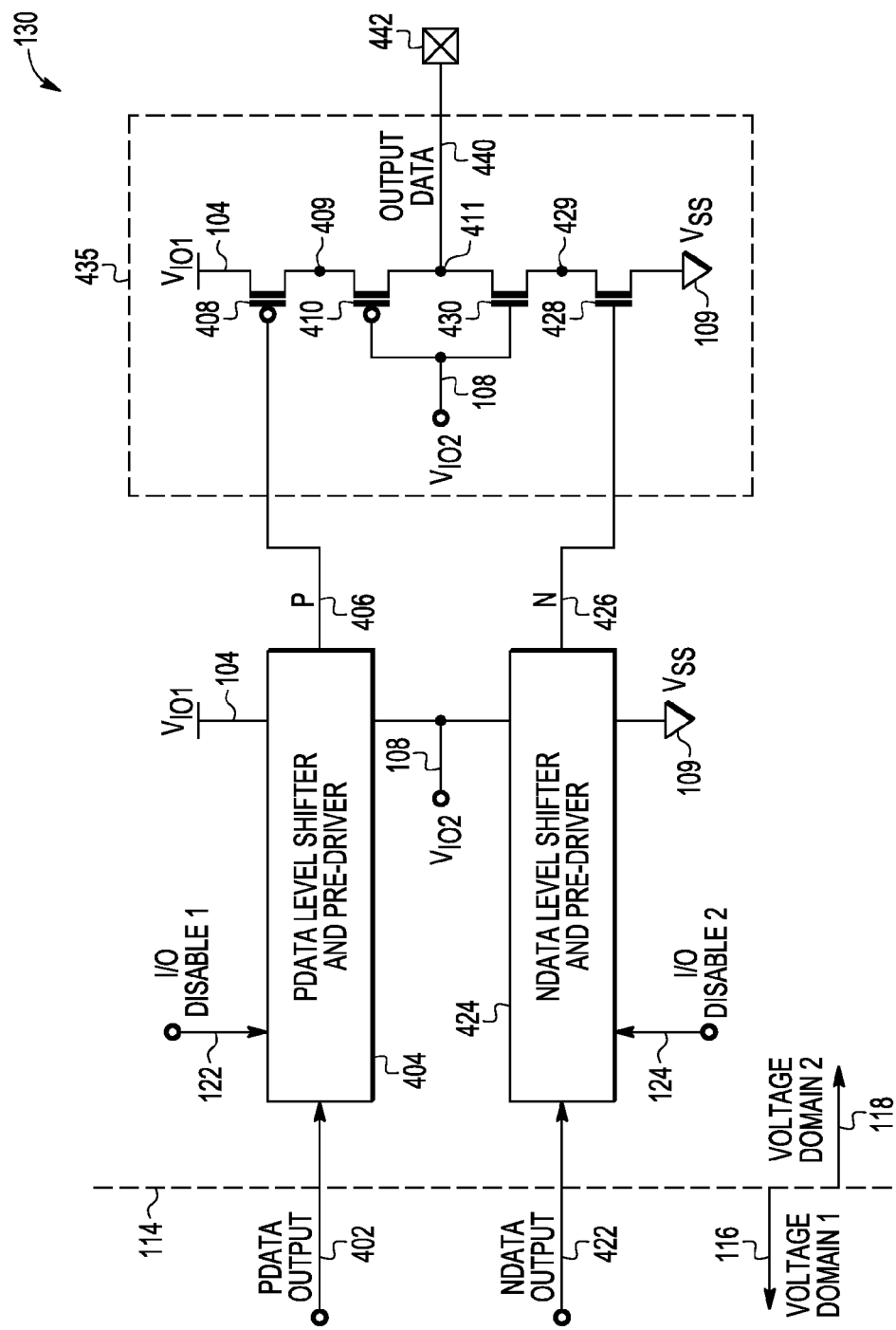
FIG. 4 is a diagram for an input/output cell that receives multiple disable signals from a dual-voltage detector.

FIG. 4 is a diagram for an I/O cell 130 that receives two disable signals 122/124 from the dual-voltage detector 120. An output pin 442 receives output data 440 driven by a stacked output driver 435. For the embodiment depicted, a differential data signal is received including a positive data (PDATA) output 402 and a negative data (NDATA) output 422. The PDATA level shifter and pre-driver 404 receives the positive data output 402 and provides a control value (P) 406 to the pull-up side of the stacked output driver 435. The PDATA level shifter and pre-driver 404 drives the control value (P) 406 between the first I/O supply voltage ($V_{IO1}$) 104 and the second I/O supply voltage ($V_{IO2}$) 108, which are used to power the PDATA level shifter and pre-driver 404. The NDATA level shifter and pre-driver 424 receives the negative data output 422 and provides a control value (N) 426 to the pull-down side of the stacked output driver 435. The NDATA level shifter and pre-driver 424 drives the control value (N) 426 between the second I/O supply voltage ($V_{IO2}$) 108 and ground ($V_{SS}$) 109, which are used to power the NDATA level shifter and pre-driver 424. The output driver 435 includes PMOS (p-type metal oxide semiconductor) transistors 408 and 410 and NMOS (n-type metal oxide semiconductor) transistors 428 and 430. Transistor 408 has its gate coupled to the control value (P) 406 and has its source/drain coupled between the first I/O supply voltage ($V_{IO1}$) 104 and node 409. Transistor 410 has its gate coupled to the second I/O supply voltage ($V_{IO2}$) 108 and has its source/drain coupled between node 409 and node 411, which is connected to the data output pad 442. Transistor 428 has its gate coupled to the control value (N) 426 and has its source/drain coupled between ground ($V_{SS}$) 109 and node 429. Transistor 430 has its gate coupled to the second I/O supply voltage ($V_{IO2}$) 108 and has its source/drain coupled between node 429 and node 411, which is connected to the data output pad 442. It is noted that the control value (P) 406 and the control value (N) 426 are configured to be in the same phase. It is further noted that positive data (PDATA) output 402 and a negative data (NDATA) output 422 can also be configured to be in the same phase depending upon implementations used for the PDATA level shifter and pre-driver 404 and the NDATA level shifter and pre-driver 424.

During normal data operations when the core supply voltage ($V_{CORE}$) 106 is stable, the PDATA output 402 and the NDATA output 422 provide a differential output data signal that represents logic ones or logic zeroes that are to be output as output data 440 on external pad 442. The PDATA output 402 and the NDATA output 422 are signals operating within the first voltage domain 116, while the other circuitry depicted operates in the second voltage domain 118 to the right of dashed line 114. The PDATA level shifter and pre-driver 404 receives the PDATA output 402 and outputs the control value (P) 406 to the gate of PMOS transistor 408. This control value (P) 406 will be a high logic level equal to the first I/O supply voltage ($V_{IO1}$) 104 if the output data 440 is to be a low logic level and will be a low logic level equal to the second I/O supply voltage ($V_{IO2}$) 108 if the output data 440 is to be a high logic level. The NDATA level shifter and pre-driver 424 receives the NDATA output 422 and outputs the control value (N) 426 to the gate of NMOS transistor 428. This control value (N) 426 will be a high logic level equal to the second I/O supply voltage ($V_{IO2}$) 108 if the output data 440 is to be a low logic level and will be a low logic level equal to ground ($V_{SS}$) 109 if the output data 440 is to be a high logic level. As indicated above, the PDATA level shifter and pre-driver 404, the NDATA level shifter and pre-driver 424, and the output driver 435 operate in the second voltage domain 118.

If the core supply voltage ($V_{CORE}$) 106 is not stable, then the first and second I/O disable signals 122/124 will be asserted. The first I/O disable signal (I/O DISABLE1) 122 is received by the PDATA level shifter and pre-driver 404 and when asserted causes the control value (P) 406 to be set to a high logic level equal to the first I/O supply voltage ($V_{IO1}$) 104. This high logic level causes the PMOS transistor 408 to be turned off when the core supply voltage ($V_{CORE}$) 106 is not stable. The second I/O disable signal (I/O DISABLE2) 124 is received by the NDATA level shifter and pre-driver 424 and when asserted causes the control value (N) 426 to be set to a low logic level equal to ground ($V_{SS}$) 109. This low logic level causes the NMOS transistor 428 to be turned off when the core supply voltage ($V_{CORE}$) 106 is not stable. As assertion of the disable signals 122/124 will cause both transistors 408 and 428 to be turned off when the core supply voltage ($V_{CORE}$) 106 is not stable, the output pad 442 will be tri-stated to be in a high impedance (HIGH-Z) state that protects the output driver 435 from undesirable current flow. As described above, while the core supply voltage ($V_{CORE}$) 106 is within the first voltage domain 116, the first and second I/O disable signals 122/124 are within the second voltage domain 118.

The TABLE below provides a summary of example logic values (e.g., 1 or 0) and associated voltage levels (e.g., $V_{CORE}$, $V_{IO1}$, $V_{IO2}$, or $V_{SS}$) for the example embodiment described with respect to FIG. 4 for conditions where the control signal ($V_{CORE}$ GOOD) 112 indicates that the core voltage level is stable (e.g., $V_{CORE}$ GOOD=1) and where the control signal ($V_{CORE}$ GOOD) 112 indicates that the core voltage level is not stable (e.g., $V_{CORE}$ GOOD=0).

| $V_{CORE}$ GOOD | I/O DISABLE1 | I/O DISABLE2 | P | N | OUT-PUT DATA |
|---|---|---|---|---|---|
| 1 ($V_{CORE}$) | 0 ($V_{IO2}$) | 0 ($V_{SS}$) | 0 ($V_{IO2}$) | 0 ($V_{SS}$) | Logic 1 |
| 1 ($V_{CORE}$) | 0 ($V_{IO2}$) | 0 ($V_{SS}$) | 1 ($V_{IO1}$) | 1 ($V_{IO2}$) | Logic 0 |
| 0 ($V_{SS}$) | 1 ($V_{IO1}$) | 1 ($V_{IO2}$) | 1 ($V_{IO1}$) | 0 ($V_{SS}$) | HIGH-Z |

For the TABLE above, it is assumed that the core voltage control signal ($V_{CORE}$ GOOD) 112 is asserted as a high logic level when the core supply voltage ($V_{CORE}$) 106 is stable. It is also assumed that the first and second I/O disable signals 122/124 are asserted as high logic levels when the core supply voltage ($V_{CORE}$) 106 is not stable. It is further noted that in one example implementation, voltage levels of 1.8 volts, 1.2 volts, 0.9 volts, and ground ($V_{SS}$) could be used. For example, the first I/O supply voltage ($V_{IO1}$) 104 can be 1.8 volts; the core supply voltage ($V_{CORE}$) 106 can be 1.2 volts; the second I/O supply voltage ($V_{IO2}$) 108 can be 0.9 volts; and ground ($V_{SS}$) can be 0 volts. It is noted that other and/or additional voltage levels could also be used, as well as different logic levels for assertion and de-assertion, while still taking advantage of the dual-voltage detector embodiments described herein that detect stable voltage levels from one voltage domain and provide multiple disable outputs in another voltage domain.

Figure 5:
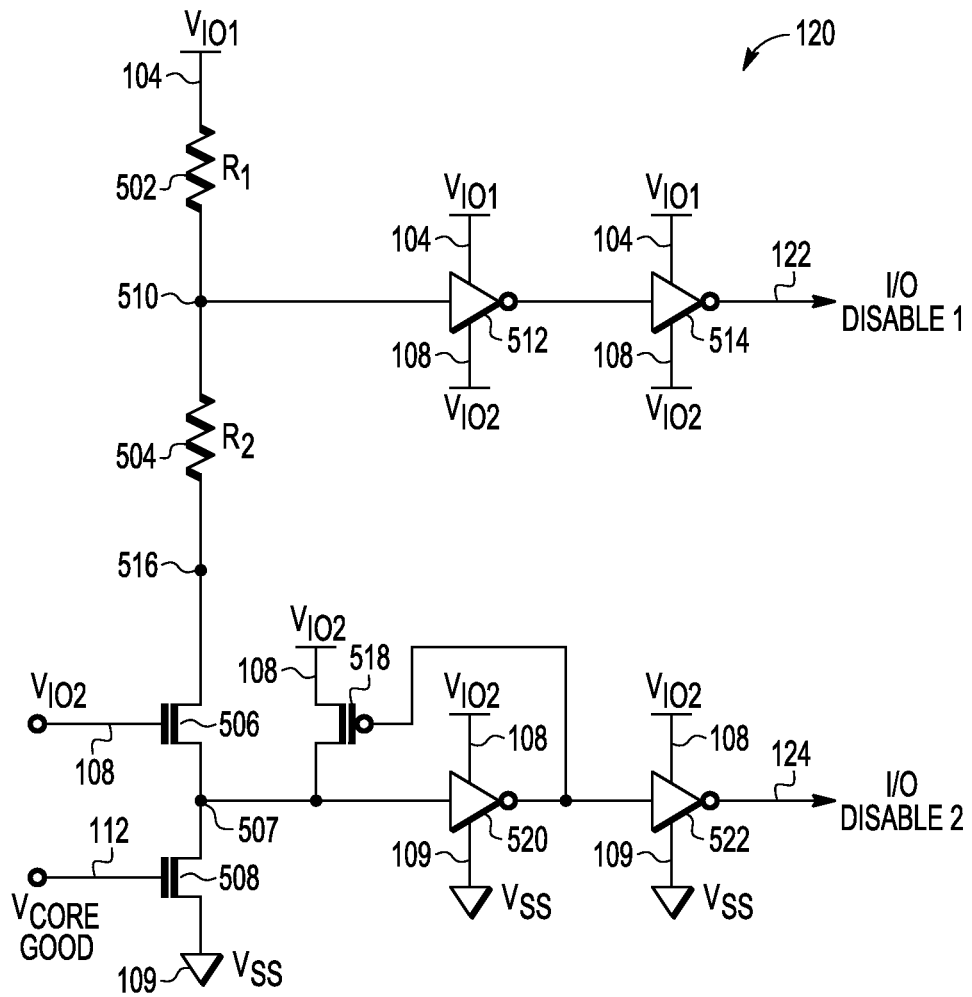
FIG. 5 is a circuit diagram of an example embodiment for a dual-voltage detector.

FIG. 5 is a circuit diagram of an example embodiment for a dual-voltage detector 120. A first resistance (R1) 502 is coupled between the first I/O supply voltage ($V_{IO1}$) 104 and node 510. A second resistance (R2) 504 is coupled between node 510 and node 516. An NMOS bias transistor 506 has its gate coupled to the second I/O supply voltage ($V_{IO2}$) 108 and its source/drain coupled between node 516 and node 507. An NMOS transistor 508 has its gate coupled to the core voltage control signal ($V_{CORE}$ GOOD) 112 and its source/drain coupled between node 507 and ground ($V_{SS}$) 109. As described above, the control signal ($V_{CORE}$ GOOD) 112 operates in the first voltage domain 116 while the other circuitry in FIG. 5 operates in the second voltage domain 118.

The output of inverter 514 provides the first I/O disable signal (I/O DISABLE1) 122. The input of inverter 514 is coupled to the output of inverter 512. The input of inverter 512 is coupled to node 510. The inverters 512/514 operate with the first I/O supply voltage ($V_{IO1}$) 104 as the high supply voltage and the second I/O supply voltage ($V_{IO2}$) 108 as the low supply voltage. As such, the outputs from inverters 512/514 move between a high logic level equal to the first I/O supply voltage ($V_{IO1}$) 104 and a low logic level equal to the second I/O supply voltage ($V_{IO2}$) 108.

The output of inverter 522 provides the second I/O disable signal (I/O DISABLE2) 124. The input of inverter 522 is coupled to the output of inverter 520. The input of inverter 520 is coupled to node 507. A PMOS feedback transistor 518 has its gate coupled to the output of inverter 520 and its source/drain coupled between the second I/O supply voltage ($V_{IO2}$) 108 and the input of inverter 520. The inverters 520/522 operate with the second I/O supply voltage ($V_{IO2}$) 108 as the high supply voltage and ground ($V_{SS}$) 109 as the low supply voltage. As such, the outputs from inverters 520/522 move between a high logic level equal to the second I/O supply voltage ($V_{IO2}$) 108 and a low logic level equal to ground ($V_{SS}$) 109.

During normal data operations when the core supply voltage ($V_{CORE}$) 106 is stable, the core voltage control signal ($V_{CORE}$ GOOD) 112 is asserted at a high logic level thereby turning on NMOS transistor 508. The second I/O supply voltage ($V_{IO2}$) 108 will also be a stable voltage level turning on NMOS bias transistor 506. With transistor 508 turned on, node 507 will be pulled towards ground ($V_{SS}$) 109. The output of inverter 520 will then be high, and the output of inverter 522 will be low. As such, the second I/O disable signal (I/O DISABLE2) 124 is in its de-asserted low voltage state. A voltage level about ground ($V_{SS}$) 109 will be a low logic level for inverter 522 as the inverters 520/522 operate with the second I/O supply voltage ($V_{IO2}$) 108 as the high supply voltage and ground ($V_{SS}$) 109 as the low supply voltage. Also during normal data operations, the resistor divider formed by resistances 502/504 between the first I/O supply voltage ($V_{IO1}$) 104 and node 516 will cause node 510 to be at a voltage level that is lower than the second I/O supply voltage ($V_{IO2}$) 108. For example, the sizes for resistance (R1) 502 and resistance (R2) 504 can be selected such that voltage level at node 510 will be less than the second I/O supply voltage ($V_{IO2}$) 108 (e.g., $V_{IO1}[R2/(R1+R2)]<V_{IO2}$) in order to help avoid shoot-through leakage. A voltage level about the level of the second I/O supply voltage ($V_{IO2}$) 108 will be a low logic level for inverter 512 as the inverters 512/514 operate with the first I/O supply voltage ($V_{IO1}$) 104 as the high supply voltage and the second I/O supply voltage ($V_{IO2}$) 108 as the low supply voltage. With node 510 being at a voltage level less than the second I/O supply voltage ($V_{IO2}$) 108, the output of inverter 512 will then be a high voltage level, and the output of inverter 514 will be a low voltage level at the level of the second I/O supply voltage ($V_{IO2}$) 108. As such, the first I/O disable signal (I/O DISABLE1) 122 is in its de-asserted low voltage state. It is noted that example values for resistance (R1) 502 and resistance (R2) 504 are a 500 kilo-ohm resistance for resistance (R1) 502 and a 450 kilo-ohm resistance for resistance (R2) 504, although other resistance values could also be used. Further, the resistances 502/504 can be implemented with one or more resistors and/or resistor networks, as desired.

When the core supply voltage ($V_{CORE}$) 106 is not stable, the control signal ($V_{CORE}$ GOOD) 112 will be de-asserted at a low logic level thereby turning off NMOS transistor 508. As such, node 510 will move to a voltage level at about the first I/O supply voltage ($V_{IO1}$) 104. Node 507 will move to a high voltage level of about the second I/O supply voltage ($V_{IO2}$) less a threshold voltage (e.g., about 0.3 volts) for NMOS bias transistor 506 as NMOS bias transistor 506 will be turned on by the second I/O supply voltage ($V_{IO2}$). With nodes 510 and 507 at high voltage levels, the outputs of inverters 512/520 will then be low logic levels, and the outputs of inverters 514/522 will be high logic levels. As such, the first I/O disable signal (I/O DISABLE1) 122 and the second I/O disable signal (I/O DISABLE2) 124 will be at their asserted high voltage states.

It is noted that PMOS feedback transistor 518 can be configured to be a weak PMOS transistor that helps to pull up node 507 to the second I/O supply voltage ($V_{IO2}$) when the core supply voltage ($V_{CORE}$) 106 is not stable and the control signal ($V_{CORE}$ GOOD) 112 is de-asserted at a low logic level turning off NMOS transistor 508. As indicated above, when NMOS transistor 508 is off, node 507 will move to a high voltage level of about the second I/O supply voltage ($V_{IO2}$) less a threshold voltage (e.g., about 0.3 volts) for NMOS bias transistor 506. Inverter 520 can be sized to provide a relatively low switch point such that the output of inverter 520 will switch to a low logic level relatively quickly as the voltage level of node 507 rises. When the output of inverter 520 goes to a low logic level, PMOS feedback transistor 518 will be turned on. When PMOS feedback transistor 518 is on, it will pull node 507 to the second I/O supply voltage ($V_{IO2}$) 108 thereby helping to keep the output of inverter 520 at a low logic level and the second I/O disable signal (I/O DISABLE 2) 124, which is provided by the output of inverter 522, in its asserted high voltage state. It is further noted that a relatively low switch point for inverter 520 can be achieved by implementing inverter as a CMOS inverter with a PMOS transistor that is about equal to the size of the NMOS transistor, while the other inverters 512/514, and 522 can be implemented as CMOS inverters with PMOS transistors that are about twice the size of the NMOS transistors. Other variations could also be implemented.

Figure 6:
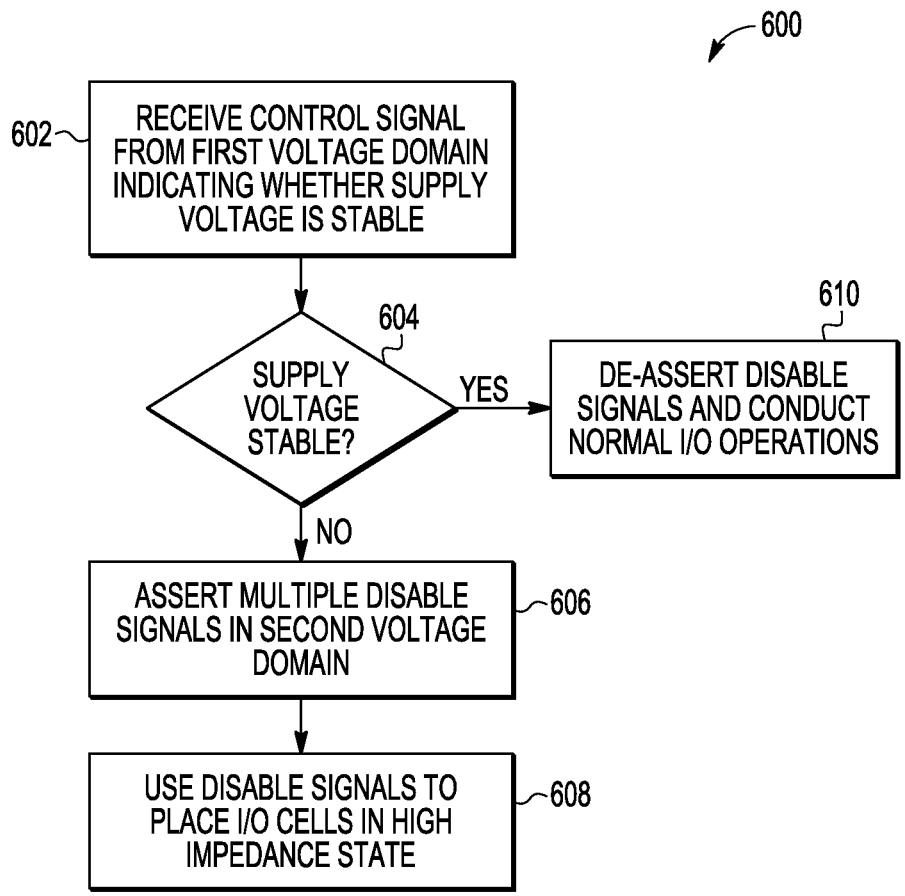
FIG. 6 is a process flow diagram of an example embodiment for using a dual-voltage detector to generate multiple disable signals for input/output cells.

FIG. 6 is a process flow diagram of an example embodiment 600 for using a dual-voltage detector to generate multiple disable signals for I/O cells. In block 602, a control signal is received from a first voltage domain indicating whether or not the supply voltage for the first voltage domain is stable. In block 604, a determination is made whether or not the supply voltage is stable. If "NO," then flow passes to block 606 where multiple disable signals are asserted within a second voltage domain. From block 606, flow then passes to block 608 where the disable signals are used to place I/O cells in a high impedance state. If the determination in block 604 is "YES," then flow passes to block 610 where the disable signals are de-asserted, and normal I/O data operations are conducted. It is also noted that the control signal indicating whether the supply voltage is stable, such as the core voltage control signal ($V_{CORE}$ GOOD) 112, can be monitored over time using embodiment 600 such that the I/O cells will be placed in a high impedance state whenever the control signal indicates that the supply voltage is not stable. Other variations could also be implemented.

As described herein, a variety of embodiments can be implemented and different features and variations can be implemented, as desired.

For one disclosed embodiment, a dual-voltage detector includes a control input configured to receive a control signal from a first voltage domain where the control signal indicating whether or not a supply voltage for the first voltage domain is stable, and a plurality of disable outputs configured to have one voltage level if the control signal indicates that the supply voltage is stable and a different voltage level if the control signal indicates that the supply voltage is not stable where the voltage levels for the plurality of disable outputs being in a second voltage domain.

In further embodiments, the plurality of disable outputs are configured to use at least two different sets of logic voltage levels. In addition, the first voltage domain can be configured to be used for core functions within an integrated circuit, and the second voltage domain can be configured to be used for input/output circuitry.

In other embodiments, the plurality of disable outputs can include a first disable output configured to have a first voltage level if the control signal indicates that the supply voltage is not stable and a second voltage level if the control signal indicates that the supply voltage is stable, and a second disable output configured to have the second voltage level if the control signal indicates that the supply voltage is not stable and a third voltage level if the control signal indicates that the supply voltage is stable. Further, the first voltage level, the second voltage level, and the third voltage level are in the second voltage domain, and the first voltage level is higher than the second voltage level and the second voltage level is higher than the third voltage level.

For still further embodiments, the plurality of disable outputs can include a first disable output having a first set of logic levels and second disable output having a second set of logic levels. In addition, the dual-voltage detector can also include a resistor divider coupled between a supply voltage level for the second voltage domain and a first node, a bias transistor coupled between the first node and a second node, and a switch coupled between the second node and ground, the switch providing the control input and being controlled by the control signal. Further, an internal node within the resistor divider can be used to provide the first disable output and the second node is used to provide the second disable output. Still further, the dual-voltage detector can further include a first set of two inverters coupled to the internal node and configured to provide the first disable output and a second set of two inverters coupled to the second node and configured to provide the second disable output. Also, a feedback transistor can be coupled to a first of the second set of two inverters.

For another disclosed embodiment, a system includes a power management controller configured to receive a supply voltage for a first voltage domain and to output a control signal indicating whether or not the supply voltage for the first voltage domain is stable, a dual-voltage detector configured to receive the control signal from the first voltage domain and to assert a plurality of disable outputs when the control signal indicates that the supply voltage for the first voltage domain is not stable where the disable outputs are within a second voltage domain, and at least one input/output cell configured to receive the disable outputs and to have a high impedance state when the disable outputs are asserted.

In further embodiments, the at least one input/output cell can include a stacked output driver controlled by a pull-up side control signal and a pull-down side control signal. In addition, the plurality of disable outputs can be configured to have one voltage level if the control signal indicates that the supply voltage is stable and a different voltage level if the control signal indicates that the supply voltage is not stable. Further, the first voltage domain can be configured to be used for core functions within an integrated circuit, and the second voltage domain can be configured to be used for input/output circuitry.

For a further disclosed embodiment, a method includes receiving a control signal indicating whether or not a supply voltage for a first voltage domain is stable, and asserting a plurality of disable outputs when the control signal indicates that the supply voltage for the first voltage domain is not stable where the disable outputs being within a second voltage domain.

In further embodiments, the method can include placing at least one input/output cell in a high impedance state when the disable outputs are asserted. In addition, the at least one input/output cell can be a stacked output driver controlled by a pull-up side control signal and a pull-down side control signal. Further, the plurality of disable outputs can have one voltage level if the control signal indicates that the supply voltage is stable and can have a different voltage level if the control signal indicates that the supply voltage is not stable. Still further, the plurality of disable outputs can include a first disable output having a first set of logic levels and second disable output having a second set of logic levels.

In still further embodiments, the method can include using a resistor divider, a bias transistor, and a switch coupled between a supply voltage level for the second voltage domain and ground to generate the first and second disable outputs, the switch receiving the control signal. In addition, the method can also include using a first set of two inverters coupled to a node within the resistor divider to generate the first disable output, using a second set of two inverters coupled to a node between the bias transistor and the switch to generate the second disable output, and using a feedback transistor coupled to a first of the second set of inverters to reduce leakage current.

Unless stated otherwise, terms such as "first" and "second" are used to arbitrarily distinguish between the elements such terms describe. Thus, these terms are not necessarily intended to indicate temporal or other prioritization of such elements.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the invention is described herein with reference to specific embodiments, various modifications and changes can be made without departing from the scope of the present invention. Accordingly, the specification and figures are to be regarded in an illustrative rather than a restrictive sense, and such modifications are intended to be included within the scope of the present invention. Further, any benefits, advantages, or solutions to problems that are described herein with regard to specific embodiments are not intended to be construed as a critical, required, or essential feature or element of any or all the claims.

What is claimed is:

1. A dual-voltage detector, comprising:
a control input configured to receive a control signal from a first voltage domain, the control signal indicating whether or not a supply voltage for the first voltage domain is stable;
a first disable output configured to have a first set of voltage levels including a voltage level when the control signal indicates that the supply voltage is stable and a different voltage level when the control signal indicates that the supply voltage is not stable, the voltage levels being in a second voltage domain;
a second disable output configured to have a second set of voltage levels including a voltage level when the control signal indicates that the supply voltage is stable and a different voltage level when the control signal indicates that the supply voltage is not stable, the voltage levels being in the second voltage domain;
a resistor divider coupled between a supply voltage level for the second voltage domain and a second node; and
a switch coupled between the second node and ground, the switch providing the control input and being controlled by the control signal;
wherein an internal node within the resistor divider is used to provide the first disable output and the second node is used to provide the second disable output.

2. The dual-voltage detector of claim 1, further comprising a bias transistor coupled between a first node and the second node, and wherein the resistor divider is coupled between the supply voltage level and the first node.

3. The dual-voltage detector of claim 1,
wherein the first disable output is configured to have a first voltage level when the control signal indicates that the supply voltage is not stable and a second voltage level when the control signal indicates that the supply voltage is stable; and
wherein the second disable output is configured to have the second voltage level when the control signal indicates that the supply voltage is not stable and a third voltage level when the control signal indicates that the supply voltage is stable;
wherein the first voltage level, the second voltage level, and the third voltage level are in the second voltage domain; and
wherein the first voltage level is higher than the second voltage level and the second voltage level is higher than the third voltage level.

4. The dual-voltage detector of claim 1, wherein the first voltage domain is configured to be used for core functions within an integrated circuit, and wherein the second voltage domain is configured to be used for input/output circuitry.

5. The dual-voltage detector of claim 1, wherein the switch is configured to turn on when the control signal indicates that the supply voltage is stable and to turn off when the control signal indicates the supply voltage is not stable.

6. The dual-voltage detector of claim 1, further comprising a first set of two inverters coupled to the internal node and configured to provide the first disable output and a second set of two inverters coupled to the second node and configured to provide the second disable output.

7. The dual-voltage detector of claim 6, further comprising a feedback transistor coupled to a first of the second set of two inverters.

8. A system, comprising
a power management controller configured to receive a supply voltage for a first voltage domain and to output a control signal indicating whether or not the supply voltage for the first voltage domain is stable;
a dual-voltage detector configured to receive the control signal from the first voltage domain and to assert a plurality of disable outputs when the control signal indicates that the supply voltage for the first voltage domain is not stable, the disable outputs being within a second voltage domain; and
at least one input/output cell configured to receive the disable outputs and to have a high impedance state when the disable outputs are asserted;
wherein the dual-voltage detector comprises:
a control input configured to receive the control signal;
a first disable output configured to have a first set of voltage levels including a voltage level if the control signal indicates that the supply voltage is stable and a different voltage level if the control signal indicates that the supply voltage is not stable, the voltage levels being in the second voltage domain;
a second disable output configured to have a second set of voltage levels including a voltage level if the control signal indicates that the supply voltage is stable and a different voltage level if the control signal indicates that the supply voltage is not stable, the voltage levels being in the second voltage domain;
a resistor divider coupled between a supply voltage level for the second voltage domain and a second node; and
a switch coupled between the second node and ground, the switch providing the control input and being controlled by the control signal;
wherein an internal node within the resistor divider is used to provide the first disable output and the second node is used to provide the second disable output.

9. The system of claim 8, wherein the at least one input/output cell comprises a stacked output driver controlled by a pull-up side control signal and a pull-down side control signal.

10. The system of claim 8, wherein the first voltage domain is configured to be used for core functions within an integrated circuit, and wherein the second voltage domain is configured to be used for input/output circuitry.

11. The system of claim 8, further comprising a bias transistor coupled between a first node and the second node, and wherein the resistor divider is coupled between the supply voltage level and the first node.

12. The system of claim 8,
wherein the first disable output is configured to have a first voltage level when the control signal indicates that the supply voltage is not stable and a second voltage level when the control signal indicates that the supply voltage is stable; and
wherein the second disable output is configured to have the second voltage level when the control signal indicates that the supply voltage is not stable and a third voltage level when the control signal indicates that the supply voltage is stable;
wherein the first voltage level, the second voltage level, and the third voltage level are in the second voltage domain; and
wherein the first voltage level is higher than the second voltage level and the second voltage level is higher than the third voltage level.

13. The system of claim 8, wherein the switch is configured to turn on when the control signal indicates that the supply voltage is stable and to turn off when the control signal indicates the supply voltage is not stable.

14. A method, comprising:
receiving a control signal indicating whether or not a supply voltage for a first voltage domain is stable;
asserting first and second disable outputs when the control signal indicates that the supply voltage for the first voltage domain is not stable, the disable outputs being within a second voltage domain; and
using a resistor divider, a bias transistor, and a switch coupled between a supply voltage level for the second voltage domain and ground to generate the first and second disable outputs, the switch receiving the control signal;
wherein the first disable output has a first set of voltage levels including a voltage level when the control signal indicates that the supply voltage is stable and a different voltage level when the control signal indicates that the supply voltage is not stable;
wherein the second disable output has a second set of voltage levels including a voltage level when the control signal indicates that the supply voltage is stable and a different voltage level when the control signal indicates that the supply voltage is not stable; and
wherein an internal node within the resistor divider is used to provide the first disable output and a second node between the resistor divider and the switch is used to generate the second disable output.

15. The method of claim 14, further comprising placing at least one input/output cell in a high impedance state when the disable outputs are asserted.

16. The method of claim 15, wherein the at least one input/output cell comprises a stacked output driver controlled by a pull-up side control signal and a pull-down side control signal.

17. The method of claim 14, further comprising using a first set of two inverters coupled to the internal node within the resistor divider to generate the first disable output, and using a second set of two inverters coupled to the second node between the bias transistor and the switch to generate the second disable output.

18. The method of claim 17, further comprising using a feedback transistor coupled to a first of the second set of inverters to reduce leakage current.

19. The method of claim 14, wherein a bias transistor is coupled between a first node and the second node, and wherein the resistor divider is coupled between the supply voltage level and the first node.

20. The method of claim 14,
wherein the first disable output is configured to have a first voltage level when the control signal indicates that the supply voltage is not stable and a second voltage level when the control signal indicates that the supply voltage is stable; and
wherein the second disable output is configured to have the second voltage level when the control signal indicates that the supply voltage is not stable and a third voltage level when the control signal indicates that the supply voltage is stable;
wherein the first voltage level, the second voltage level, and the third voltage level are in the second voltage domain; and
wherein the first voltage level is higher than the second voltage level and the second voltage level is higher than the third voltage level.

21. The method of claim 14, further comprising turning on the switch when the control signal indicates that the supply voltage is stable and turning off the switch when the control signal indicates the supply voltage is not stable.

* * * * *